(12) United States Patent
Westbergh

(10) Patent No.: US 10,581,224 B2
(45) Date of Patent: Mar. 3, 2020

(54) FEEDBACK BIASED VERTICAL CAVITY SURFACE EMITTING LASER

(71) Applicant: Finisar Corporation, Sunnyvale, CA (US)

(72) Inventor: Petter Westbergh, McKinney, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 16/183,679

(22) Filed: Nov. 7, 2018

(65) Prior Publication Data

US 2019/0140423 A1 May 9, 2019

Related U.S. Application Data

(60) Provisional application No. 62/582,740, filed on Nov. 7, 2017.

(51) Int. Cl.
*H01S 5/00* (2006.01)
*H01S 5/183* (2006.01)
*H01S 5/026* (2006.01)
*H01S 5/10* (2006.01)
*H01S 5/20* (2006.01)
*H01S 5/042* (2006.01)

(52) U.S. Cl.
CPC ........ *H01S 5/18327* (2013.01); *H01S 5/0264* (2013.01); *H01S 5/0425* (2013.01);
(Continued)

(58) Field of Classification Search
CPC .. H01S 5/18327; H01S 5/0264; H01S 5/0425; H01S 5/1021; H01S 5/18302;
(Continued)

(56) References Cited

U.S. PATENT DOCUMENTS

| | | | |
|---|---|---|---|
| 2002/0001111 A1* | 1/2002 | Evans | B82Y 20/00 359/34 |
| 2005/0169336 A1* | 8/2005 | Ishii | B82Y 20/00 372/50.1 |
| 2006/0198404 A1* | 9/2006 | Henrichs | H01S 5/18391 372/29.02 |
| 2018/0070423 A1* | 3/2018 | Kondo | G02F 1/3515 |

OTHER PUBLICATIONS

International Search Report and Written Opinion dated Feb. 28, 2019, in related PCT Application No. PCT/US2018/059679 (16 pages).

(Continued)

*Primary Examiner* — Kinam Park
(74) *Attorney, Agent, or Firm* — Maschoff Brennan

(57) ABSTRACT

A VCSEL may include a bottom DBR mirror and a top DBR mirror above the bottom DBR mirror. The VCSEL may include a vertical optical cavity located within a portion of the bottom and top DBR mirrors. The vertical optical cavity may be configured to emit an optical signal. The VCSEL may include a lateral feedback optical cavity located within a different portion of the bottom and the top DBR mirrors configured to receive a feedback bias signal configured to bias the lateral feedback optical cavity to adjust the optical signal. The VCSEL may include an active region formed between the bottom and the top DBR mirrors that may include an oxide layer defining an oxide aperture. The VCSEL may include an isolation implant configured to electrically isolate the vertical optical cavity from the feedback optical cavity and to create a first and a second aperture within the oxide aperture.

20 Claims, 8 Drawing Sheets

(52) U.S. Cl.
CPC ...... *H01S 5/04252* (2019.08); *H01S 5/04253* (2019.08); *H01S 5/04254* (2019.08); *H01S 5/04256* (2019.08); *H01S 5/04257* (2019.08); *H01S 5/1021* (2013.01); *H01S 5/1833* (2013.01); *H01S 5/18302* (2013.01); *H01S 5/18311* (2013.01); *H01S 5/18394* (2013.01); *H01S 5/2063* (2013.01)

(58) Field of Classification Search
CPC .. H01S 5/18311; H01S 5/1833; H01S 5/2063; H01S 5/18394; H01S 5/04252; H01S 5/04253; H01S 5/04254; H01S 5/04256; H01S 5/04257
See application file for complete search history.

(56) References Cited

OTHER PUBLICATIONS

Dalir, et al., "High Frequency Modulation of Transverse-Coupled-Cavity VCSELS for Radio Over Fiber Applications", IEEE Photonics Technology Letters, IEEE Service Center, Piscataway, NJ, US, vol. 26, No. 3, Feb. 1, 2014 (Feb. 1, 2014), pp. 281-284.

F. Koyama, "High speed modulation of transverse coupled cavity VCSELs," 2016 21st OptoElectronics and Communications Conference (OECC) held jointly with 2016 International Conference on Photonics in Switching (PS), Niigata, 2016, pp. 1-3.

Hu et al., "Chirp reduction and modulation bandwidth enhancement of transverse coupled cavity VCSEL", 2015 Opto-Electronics and Communications Conference (OECC), IEEE, Jun. 28, 2015 (Jun. 28, 2015), pp. 1-3.

\* cited by examiner

FEEDBACK BIASED VERTICAL CAVITY SURFACE EMITTING LASER

CROSS-REFERENCE TO RELATED APPLICATION

This application claims the benefit of and priority to U.S. Provisional Patent Application No. 62/582,740 filed Nov. 7, 2017, which is incorporated herein by reference.

FIELD

The embodiments discussed herein are related to feedback biased vertical cavity surface emitting lasers (VCSELs).

BACKGROUND

Unless otherwise indicated herein, the materials described herein are not prior art to the claims in the present application and are not admitted to be prior art by inclusion in this section.

VCSELs are commonly used in many modern communication components for data transmission. One use of VCSELs that has become more common is the use in data networks. VCSELs are used in many fiber optic communication systems to transmit digital data on a network. In one exemplary configuration, a VCSEL may be modulated by digital data to produce an optical signal, including periods of light and dark output that represents a binary data stream. In actual practice, the VCSEL emits a high optical output representing binary highs and a lower power optical output representing binary lows. To obtain quick reaction time, the VCSEL is constantly on, but varies from a high optical output to a lower optical output.

The subject matter claimed herein is not limited to embodiments that solve any disadvantages or that operate only in environments such as those described above. Rather, this background is only provided to illustrate one example technology where some embodiments described herein may be practiced.

SUMMARY

In at least one embodiment, a coupled cavity vertical cavity surface emitting laser (VCSEL) may include a bottom distributed Bragg reflector (DBR) mirror. The coupled cavity VCSEL may also include a top DBR mirror formed above the bottom DBR mirror. The coupled cavity VCSEL may additionally include a vertical optical cavity located within a portion of the bottom DBR mirror and a portion of the top DBR mirror. The vertical optical cavity may be configured to emit an optical signal. The coupled cavity VCSEL may include a lateral feedback optical cavity located within a different portion of the bottom DBR mirror and a different portion of the top DBR mirror. The lateral feedback optical cavity may be configured to receive a feedback bias signal to bias the lateral feedback optical cavity to adjust the optical signal. The coupled cavity VCSEL may also include an active region formed between the bottom DBR mirror and the top DBR mirror. The active region may include an oxide layer that defines an oxide aperture. The coupled cavity VCSEL may additionally include an isolation implant. The isolation implant may be configured to electrically isolate the vertical optical cavity from the lateral feedback optical cavity and to create a first aperture and a second aperture within the oxide aperture.

In at least one embodiment, a method of biasing a VCSEL may include emitting light from an active region of the VCSEL. The method may also include passing a first portion of the light through an oxide aperture optically coupled to a vertical optical cavity of the VCSEL. The method may additionally include passing a second portion of the light into a lateral feedback optical cavity of the VCSEL. The method may include biasing the lateral feedback optical cavity to adjust the light emitted by the vertical optical cavity.

In at least one embodiment, an optical transceiver may include a bottom DBR mirror. The optical transceiver may also include a top DBR mirror positioned above the bottom DBR mirror. The optical transceiver may additionally include a vertical optical cavity located within a portion of the bottom DBR mirror and a portion of the top DBR mirror. The vertical optical cavity may be configured to emit an optical signal. The optical transceiver may include a lateral feedback optical cavity located within a different portion of the bottom DBR mirror and a different portion of the top DBR mirror. The lateral feedback optical cavity is optically coupled to the vertical optical cavity and may be configured to receive a feedback bias signal. The feedback bias signal may be configured to bias the lateral feedback optical cavity to adjust the optical signal emitted by the vertical optical cavity. The optical transceiver may also include an active region between the bottom DBR mirror and the top DBR mirror. The active region may include an oxide layer. The oxide layer may define an oxide aperture. The optical transceiver may additionally include an isolation implant. The isolation implant may be configured to electrically isolate the vertical optical cavity from the lateral feedback optical cavity. The isolation implant may create a first aperture and a second aperture within the oxide aperture.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only example embodiments of the invention and are therefore not to be considered limiting of its scope. The invention will be described and explained with additional specificity and detail through the use of the accompanying drawings in which.

DETAILED DESCRIPTION

Figure 1:
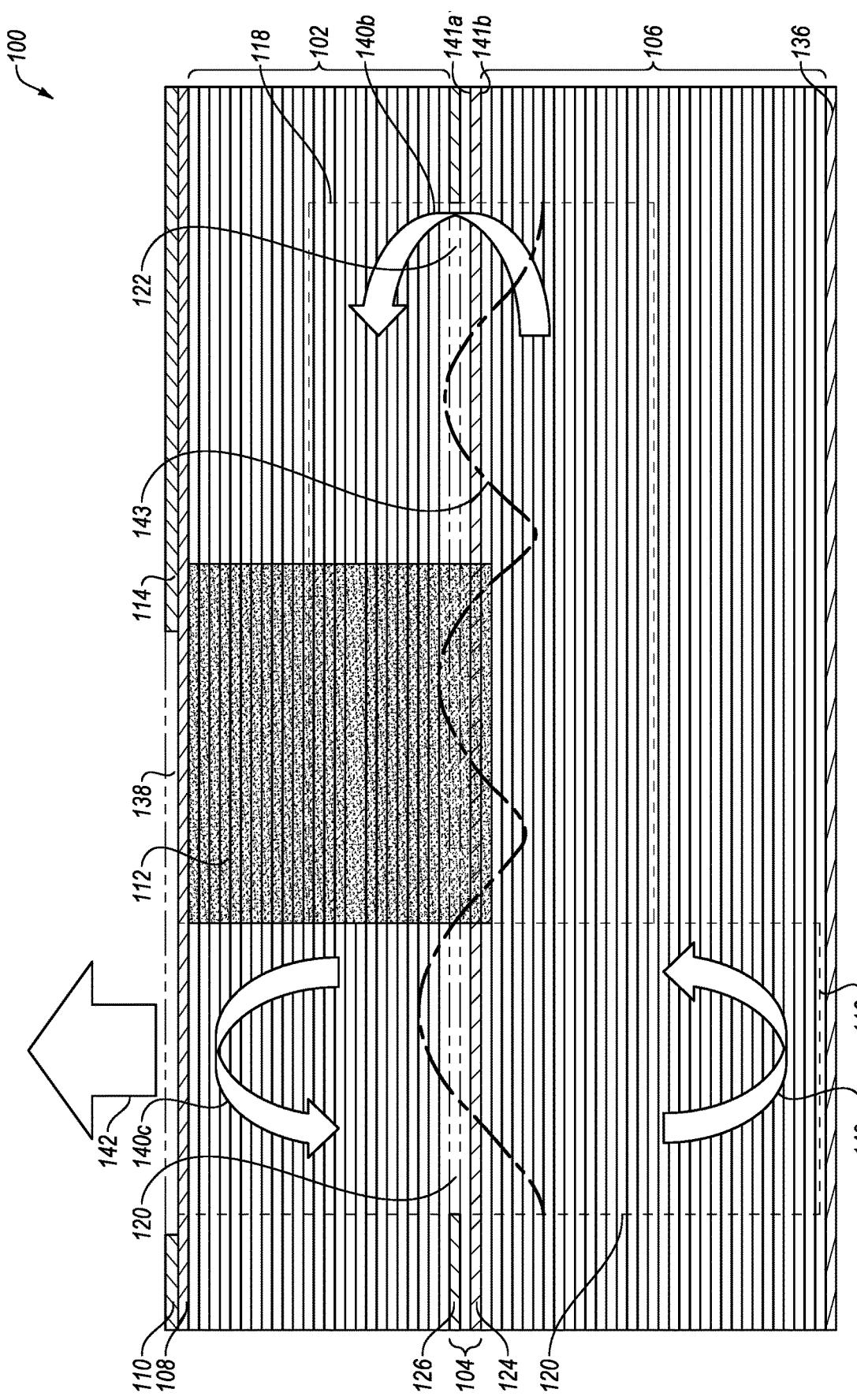
FIG. 1 illustrates a cross-sectional view of an embodiment of a feedback biased VCSEL.

In the following detailed description, reference is made to drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

One type of laser that is used in optical data transmission is a vertical cavity surface-emitting laser (VCSEL). A VCSEL may include a laser cavity that is sandwiched between and defined by two mirror stacks. A VCSEL is typically constructed on a semiconductor wafer such as Gallium Arsenide (GaAs) The VCSEL may include a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

The VCSEL functions when, e.g., a current is passed through a PN junction to inject carriers into an active region of the VCSEL. Recombination of the injected carriers from a conduction band to a valence band in quantum wells of the VCSEL produces photons that begin to travel in the laser cavity. The photons are reflected back and forth. When the bias current is sufficient, optical gain is produced in the active region. When the optical gain is equal to a cavity loss, laser oscillation occurs and the VCSEL is said to be at threshold bias and the VCSEL begins to "lase" as the optically coherent photons are emitted from the top of the VCSEL.

Generally, the present technology relates to feedback biased VCSELs (e.g., coupled cavity VCSELs). Biasing a portion of a feedback biased VCSEL with a feedback signal including an appropriate feedback strength combined with an appropriately sized oxide aperture included in the feedback biased VCSEL may improve a modulation response, three dB bandwidth, and/or resonance peak of an optical signal emitted by the feedback biased VCSEL. Improving the modulation response, the three dB bandwidth, and/or the resonance peak of the optical signal as described herein may enable a modulation speed of the optical signal to be increased compared to the modulation speed of an optical signal emitted by other VCSEL technologies (e.g., VCSELs that do not implement feedback biasing with the appropriate sized oxide aperture). Likewise, the three dB bandwidth of an optical signal emitted by a feedback biased VCSEL as described herein may not be limited by a relaxation oscillation frequency (ROF) as much as other VCSEL technologies, which may also permit the modulation speed of an optical signal emitted by the feedback biased VCSEL to be increased.

FIG. 1 illustrates a cross-sectional view of an embodiment of a feedback biased VCSEL 100 (e.g., a coupled cavity VCSEL 100), in accordance with at least one embodiment described herein. A bottom distributed Bragg reflector (DBR) mirror 106 may be formed on a bottom contact 136. An active region 104 may be formed on the bottom DBR mirror 106. A top DBR mirror 102 may be formed on the active region 104. An anti-reflection layer 108 may be formed proximate, on, and/or above the top DBR mirror 102. In some embodiments, the anti-reflection layer 108 may be formed on the top DBR mirror 102

An isolation implant 112 may be formed in the top DBR mirror 102 and may extend through to at least a portion of the active region 104. In some embodiments, the isolation implant 112 may extend through the active region 104 so as to contact at least a portion of the bottom DBR mirror 106. A vertical cavity 116 (e.g., a vertical optical cavity) may be formed by the bottom DBR mirror 106 and the top DBR mirror 102. A lateral feedback cavity 118 (e.g., a lateral feedback optical cavity) may also be formed by the bottom DBR mirror 106 and the top DBR mirror 102. A p contact metal layer 110 may form an electrical contact on a portion of the top DBR mirror 102. A bias metal contact 114 may form an electrical contact on a different portion of the top DBR mirror 102 electrically isolated from the p contact metal layer 110 by the isolation implant 112. In some embodiments, the bias metal contact 114 may be located proximate and/or above the lateral feedback cavity 118. The p contact metal layer 110 and the bias metal contact 114 may form and/or define an optical aperture 138 on and/or above yet a different portion of the top DBR mirror 102. The optical aperture 138 may extend over the vertical cavity 116 and at least a portion of the isolation implant 112. The optical aperture 138 may permit light as an optical signal 142 to be emitted by the feedback biased VCSEL 100.

The active region 104 may be formed from one or more quantum wells 124 that are separated from an oxide layer 126 and the bottom DBR mirror 106 by multiple quantum well barriers 141a-b. The oxide layer 126 may include a vertical cavity oxide aperture 120 bound by an oxidized portion of the oxide layer 126 and the isolation implant 112. Additionally, the oxide layer 126 may include a lateral feedback cavity oxide aperture 122 bound by an oxidized portion of the oxide layer 126 and the isolation implant 112. In some embodiments, an oxide aperture may be defined by the vertical cavity oxide aperture 120 and the lateral feedback cavity oxide aperture 122. For example, in some embodiments, the oxide aperture may include both the vertical cavity oxide aperture 120 and the lateral feedback cavity oxide aperture 122. Additionally, in some embodiments, the oxide aperture may define a space between the portions of the oxide layer 126.

During a contemplated operation, the p contact metal layer 110 may receive a biasing current, which may be injected into the quantum wells 124. At a sufficiently high bias current, the quantum wells 124 may produce light 140a-c and the feedback biased VCSEL 100 may begin to "lase" and emit light as the optical signal 142. The light 140a-c emitted by the quantum wells 124 may be emitted into the vertical cavity 116 and the lateral feedback cavity 118. The light 140a and 140c emitted into the vertical cavity 116 may be reflected vertically and towards the optical aperture 138 by the various layers included in the vertical cavity 116. In addition, a portion of the light 140a and 140c may pass through the vertical cavity oxide aperture 120. Furthermore, a portion of the light 140a and 140c may be reflected vertically and towards the bottom contact 136.

The light 140b coupled into the lateral feedback cavity 118 from the vertical cavity 116 (e.g., laterally) may be reflected by the various layers included in the lateral feedback cavity 118. Additionally, the light 140b may be reflected back towards the vertical cavity 116 by the various layers included in the lateral feedback cavity 118. Furthermore, the lateral feedback cavity oxide aperture 122 may permit the light 140b reflected back towards the vertical cavity 116 by the layers in the top DBR mirror 102 to enter the bottom DBR mirror 106 so as to enter the vertical cavity 116. In some embodiments, the bias metal contact 114 may reduce optical loss that occurs in the top DBR mirror 102 over the lateral feedback cavity 118 by enhancing reflection and by restricting output loss through the top DBR mirror 102 over which the bias metal contact 114 is formed. The light 140a-c may reflect through the bottom DBR mirror 106, the top DBR mirror 102, the vertical cavity 116, and the lateral feedback cavity 118 until the light 140a-c is emitted as the optical signal 142 out of the optical aperture 138.

Additionally, the p contact metal layer 110 may receive a radio frequency (RF) signal. The RF signal may be modulated onto the optical signal 142 by analogue or digital modulation techniques. For example, the RF signal may include a high frequency that may be imposed on the light 140a-c prior to being emitted as the optical signal 142. A possible intensity distribution of an optical standing wave may be represented by wave 143.

A direct current (DC) feedback bias voltage may be applied to the bias metal contact 114 to tune the feedback strength of the lateral feedback cavity 118. A resonance peak, a modulation response, and/or a three dB bandwidth of the optical signal 142 emitted by the feedback biased VCSEL 100 may be adjusted by modifying the DC feedback bias voltage and thereby adjusting the gain/loss of the lateral feedback cavity 118. The DC feedback bias may include a reverse bias signal and/or a forward bias signal. In some embodiments, the reverse bias signal may reduce the feedback strength through increased absorption of light within the lateral feedback cavity 118. In these and other embodiments, the forward bias signal may increase the feedback strength by compensating absorption of the light 140c within the lateral feedback cavity 118 with a gain.

A flat modulation response of the optical signal 142 emitted by the feedback biased VCSEL 100 (e.g., a low peaking of the modulation response) may be achieved by modifying the DC feedback bias voltage. Adjusting the DC feedback bias voltage so that the feedback biased VCSEL 100 emits an optical signal that includes a flat modulation response, higher three dB bandwidth, and a lower resonance peak is discussed in more detail below in relation to FIGS. 4-7.

The feedback strength as determined by the geometry of the lateral feedback cavity oxide aperture 122, the DC feedback bias applied to the bias metal contact 114, and the vertical cavity oxide aperture 120 may also improve the modulation response, the three dB bandwidth, and/or the resonance peak of the optical signal 142. Improving the modulation response, the three dB bandwidth, and/or the resonance peak of the optical signal 142 may enable a modulation speed of the optical signal 142 to be increased compared to other VCSEL technologies (e.g., VCSELs that do not implement feedback biasing of the lateral feedback cavity 118 as described herein).

Likewise, the three dB bandwidth of the optical signal 142 may not be limited by the ROF as compared to other VCSEL technologies (e.g., VCSELs that do not implement feedback biasing with the lateral feedback cavity 118). Additionally, some embodiments may permit the modulation speed of the optical signal 142 to be increased.

Figure 2:
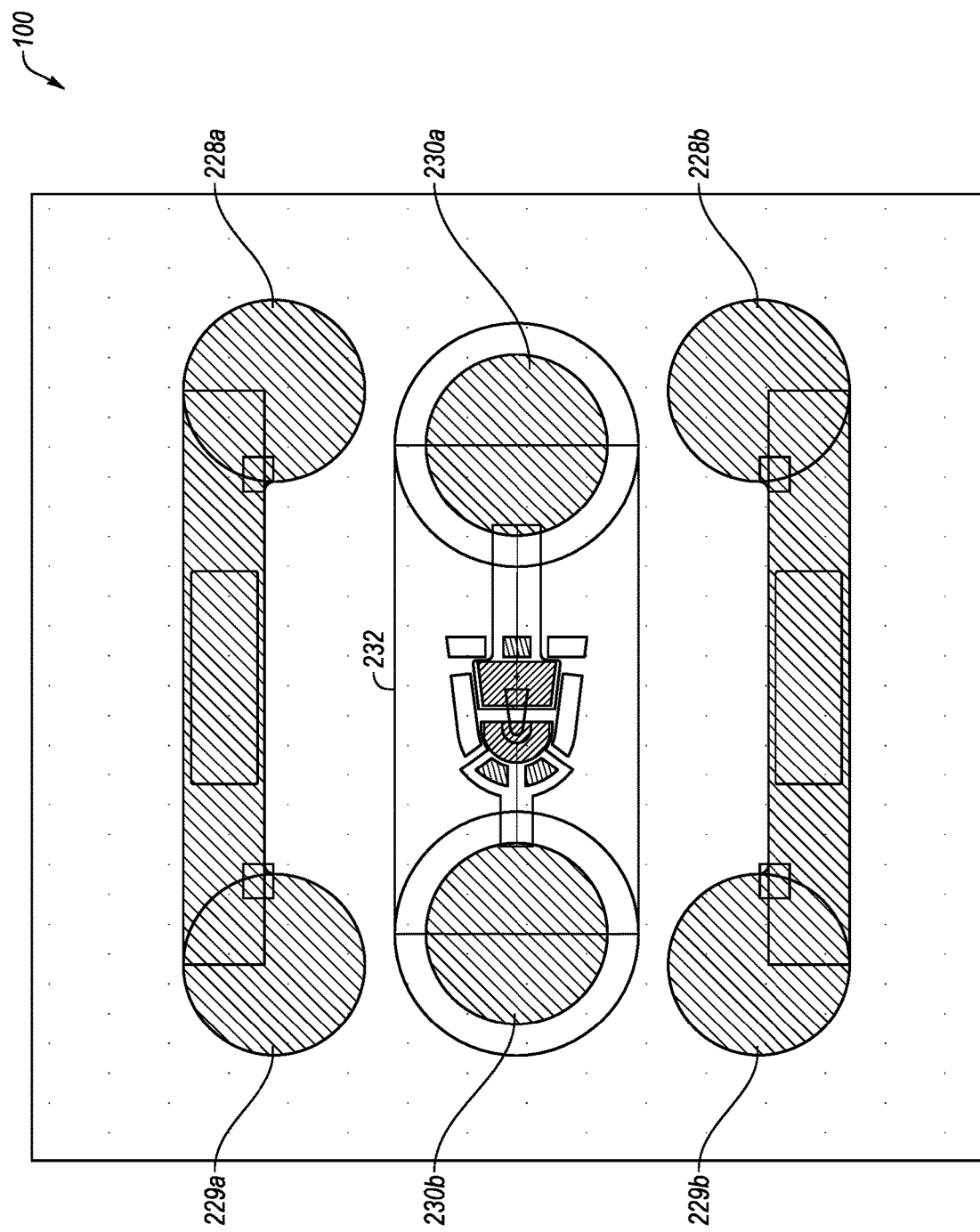
FIG. 2 illustrates a chip layout of an embodiment of the feedback biased VCSEL of FIG. 1.

FIG. 2 illustrates a chip layout of an embodiment of the feedback biased VCSEL 100 of FIG. 1, in accordance with at least one embodiment described herein. The chip layout may include a first feedback ground trace 228a and a second feedback ground trace 228b, (collectively 'feedback ground traces 228') and a first optical ground trace 229a and a second optical ground trace 229b (collectively 'optical ground traces 229'). The chip layout may also include a feedback signal trace 230a and an optical signal trace 230b. Additionally, the chip layout may include a VC SEL mesa 232.

The optical signal trace 230b may be configured to receive a biasing current plus an RF signal to inject into quantum wells of the feedback biased VCSEL 100, as discussed above in relation to FIG. 1. The optical ground traces 229 may be configured to complete a circuit permitting the biasing current and/or the RF signal to flow through the feedback biased VCSEL 100. Permitting the biasing current and/or the RF signal to flow or be injected into the quantum wells of the feedback biased VCSEL 100 may cause the feedback biased VCSEL 100 to emit light as discussed above in relation to FIG. 1.

The feedback signal trace 230a may be configured to receive a DC feedback bias voltage to tune the feedback strength of a feedback cavity of the VCSEL 100 as discussed above in relation to FIG. 1. Additionally, the feedback ground traces 228 may be configured to complete a circuit permitting the DC feedback bias voltage to enter the lateral feedback cavity 118 of the feedback biased VC SEL 100.

The VCSEL mesa 232 may include multiple components that are configured to bias the lateral feedback cavity 118 and cause the feedback biased VCSEL 100 to emit light based on the DC feedback bias voltage, the biasing current, and the RF signal received by the signal traces 230. The VCSEL mesa 232 is discussed in more detail below in relation to FIG. 3.

Figure 3:
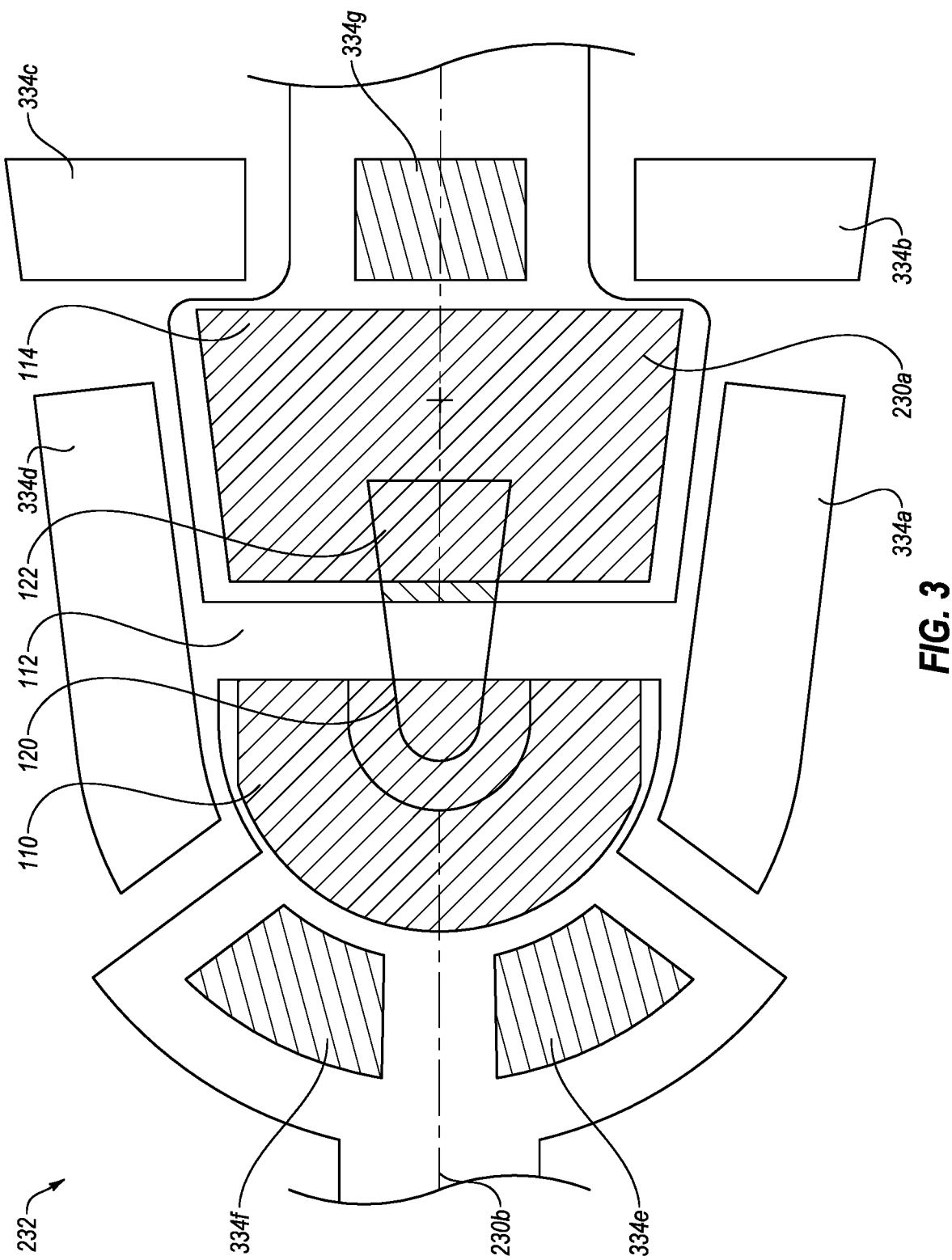
FIG. 3 illustrates a detailed view of a VCSEL mesa of the chip layout of FIG. 2.

FIG. 3 illustrates a detailed view of the VCSEL mesa 232 of the chip layout of FIG. 2, in accordance with at least one embodiment described herein. The VCSEL mesa 232 may include the p contact metal layer 110, the isolation implant 112, the bias metal contact 114, the vertical cavity oxide aperture 120, and the lateral feedback cavity oxide aperture 122. In some embodiments, the lateral feedback cavity oxide aperture 122 and the vertical cavity oxide aperture 120 may define the oxide aperture. In some embodiments, the oxide aperture may include a width of between three micrometers and fifteen micrometers. Additionally or alternatively, the oxide aperture may include a width that is less than three micrometers or greater than fifteen micrometers. Furthermore, the oxide aperture may include a length between ten and fifty micrometers.

In some embodiments, the VCSEL mesa 232 may include at least one of a first etched trench 334a, a second etched trench 334b, a third etched trench 334c, a fourth etched trench 334d, a fifth etched trench 334e, a sixth etched trench 334f, and a seventh etched trench 334g (collectively 'etched trenches 334').

Figure 4:
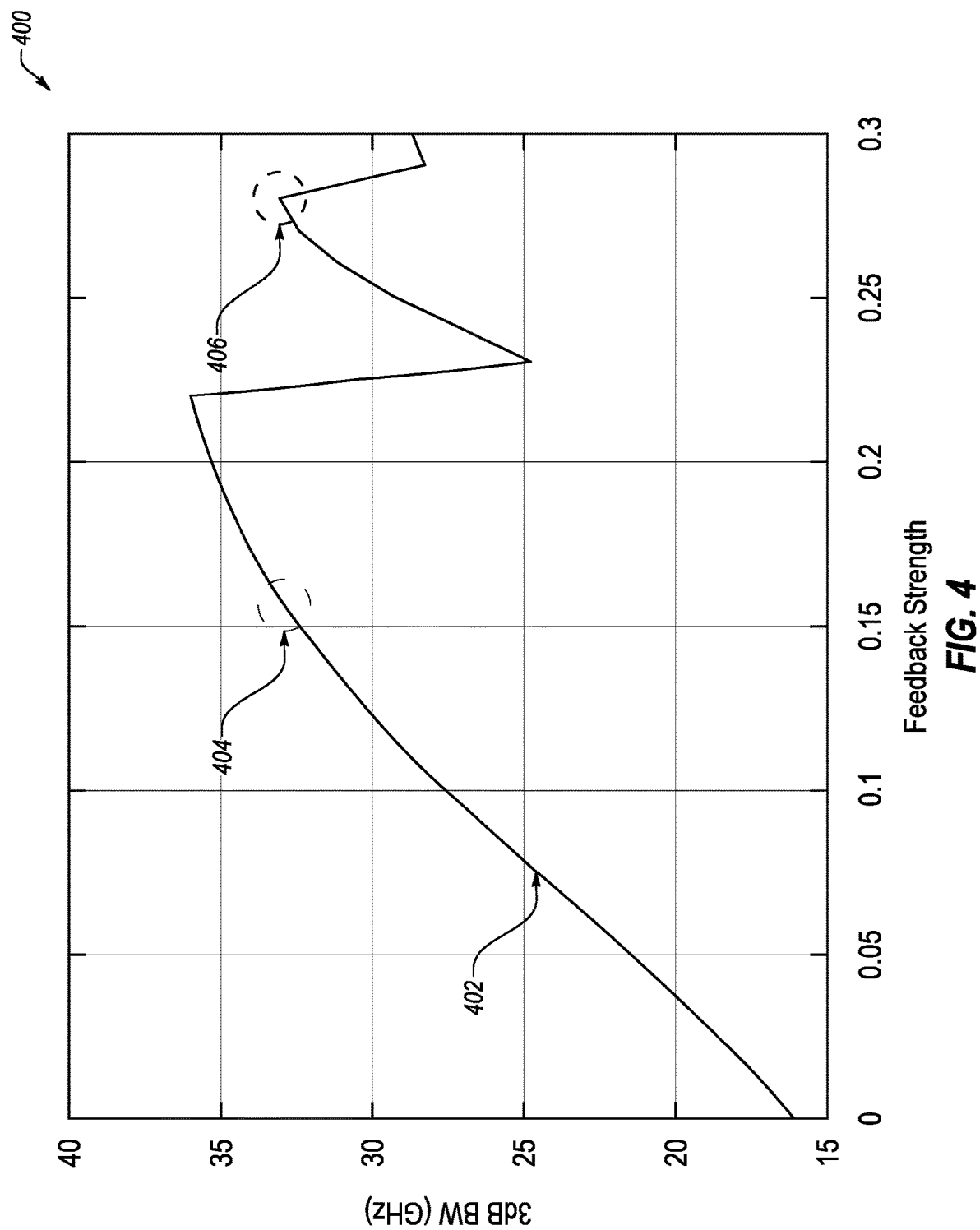
FIG. 4 includes a graphical representation of a simulation of three dB bandwidth (in Gigahertz (GHz)) of an optical signal emitted by the feedback biased VCSEL of FIG. 1 as a function of feedback strength.

FIG. 4 includes a graphical representation 400 of a simulation of three dB bandwidth (in Gigahertz (GHz)) of an optical signal emitted by the feedback biased VCSEL 100 of FIG. 1 as a function of feedback strength, in accordance with at least one embodiment described herein. The feedback strength may be determined according to equation 1.

$$\eta * \exp(-2*\alpha*L)/\sqrt{(1-\eta)}$$  Equation 1

In Equation 1, η may be the fraction of the lasing mode in the VCSEL cavity that couples to the feedback cavity, α may be the loss in the feedback cavity (per length unit), and L may be the feedback cavity length. In some embodiments, η and L may be determined by the geometry of the design and α may be tuned by the DC feedback bias applied to the lateral feedback cavity (e.g., a negative value for forward bias and a positive value for zero bias or reverse bias (e.g., loss)).

Curve 402 represents the three dB bandwidth of the optical signal as a function of the feedback strength of the feedback DC bias voltage. The circles 404 and 406 represent different sampled bandwidth selections at different feedback strengths.

In the simulation represented in the graphical representation 400, the three dB bandwidth at both of the circles 404 and 406 are substantially the same or similar. In the simulation, the three dB bandwidth of the optical signal is substantially the same or similar at a first point represented by circle 404 and a second point represented by circle 406 along the curve 402. In the simulation, the first point represented by circle 404 is located at a feedback strength of roughly 0.16 and the second point represented by circle 406 is located at a feedback strength of roughly 0.27.

In the simulation, the three dB bandwidth increases as the feedback strength is increased up to roughly 0.22 at which the three dB bandwidth sharply decreases until reaching a feedback strength of roughly 0.23 at which the three dB bandwidth begins increasing again until a feedback strength of roughly 0.27 where the three dB bandwidth yet again sharply decreases.

Figure 5:
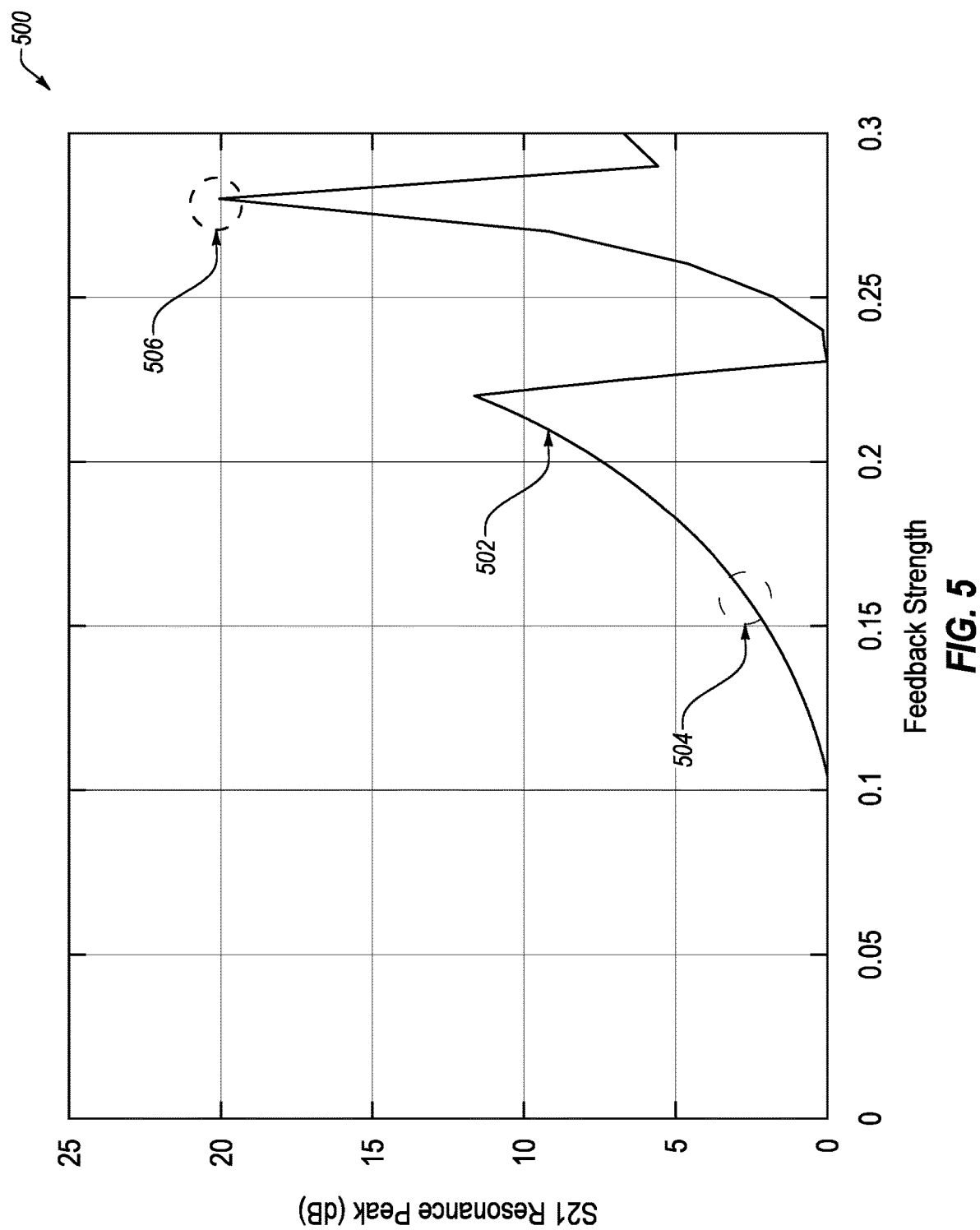
FIG. 5 includes a graphical representation of a simulation of resonance peak (in decibels (dB)) of an optical signal emitted by the feedback biased VCSEL of FIG. 1 as a function of feedback strength.

FIG. 5 includes a graphical representation 500 of a simulation of resonance peak (in decibels (dB)) of an optical signal emitted by the feedback biased VCSEL 100 of FIG. 1 as a function of feedback strength, in accordance with at least one embodiment described herein.

Curve 502 represents the resonance peak of the optical signal as a function of the feedback strength. The circles 504 and 506 represent different sampled bandwidth selections at different feedback strengths. The circles 504 and 506 may correspond to circles 404 and 406 discussed above in relation to FIG. 4, respectively. For example, both of the circles 404 and 504 may correspond to measurements at a feedback strength of roughly 0.16. Likewise, both of the circles 406 and 506 may correspond to measurements at a feedback strength of roughly 0.27.

In the simulation represented in the graphical representation 500, the resonance peak at both of the circles 504 and 506 may be different despite corresponding to similar three dB bandwidths as discussed above in relation to FIG. 4. In the simulation, the resonance peak of the optical signal at a first point represented by circle 504 may be roughly equal to three dB. In the simulation, the resonance peak of the optical signal at a second point represented by circle 506 may be roughly equal to twenty dB. Therefore, biasing the feedback biased VCSEL at roughly 0.16 feedback strength may achieve a larger three dB bandwidth that corresponds to a lower resonance peak than biasing the feedback biased VCSEL at roughly 0.27 feedback strength.

In the simulation, the resonance peak increases as the feedback strength is increased up to roughly 0.22 at which the resonance peak sharply decreases until reaching a feedback strength of roughly 0.23 at which the resonance peak generally begins increasing again until a feedback strength of roughly 0.27 where the resonance peak yet again sharply decreases. An increased resonance peak may raise a number of errors and/or other issues associated with transmitting data over the optical signal. Thus, it may be desirable to operate the feedback biased VCSEL at a relatively low resonance peak, such as at the resonance peak associated with the circle 504 in FIG. 5. It may also be desirable to operate the feedback biased VCSEL at a relatively high three dB bandwidth, such as at the three dB bandwidth associated with the circle 404 in FIG. 4. By operating the feedback biased VCSEL with a feedback strength of about 0.16, both a relatively low resonance peak and a relatively high three dB bandwidth may be simultaneously achieved.

Figure 6:
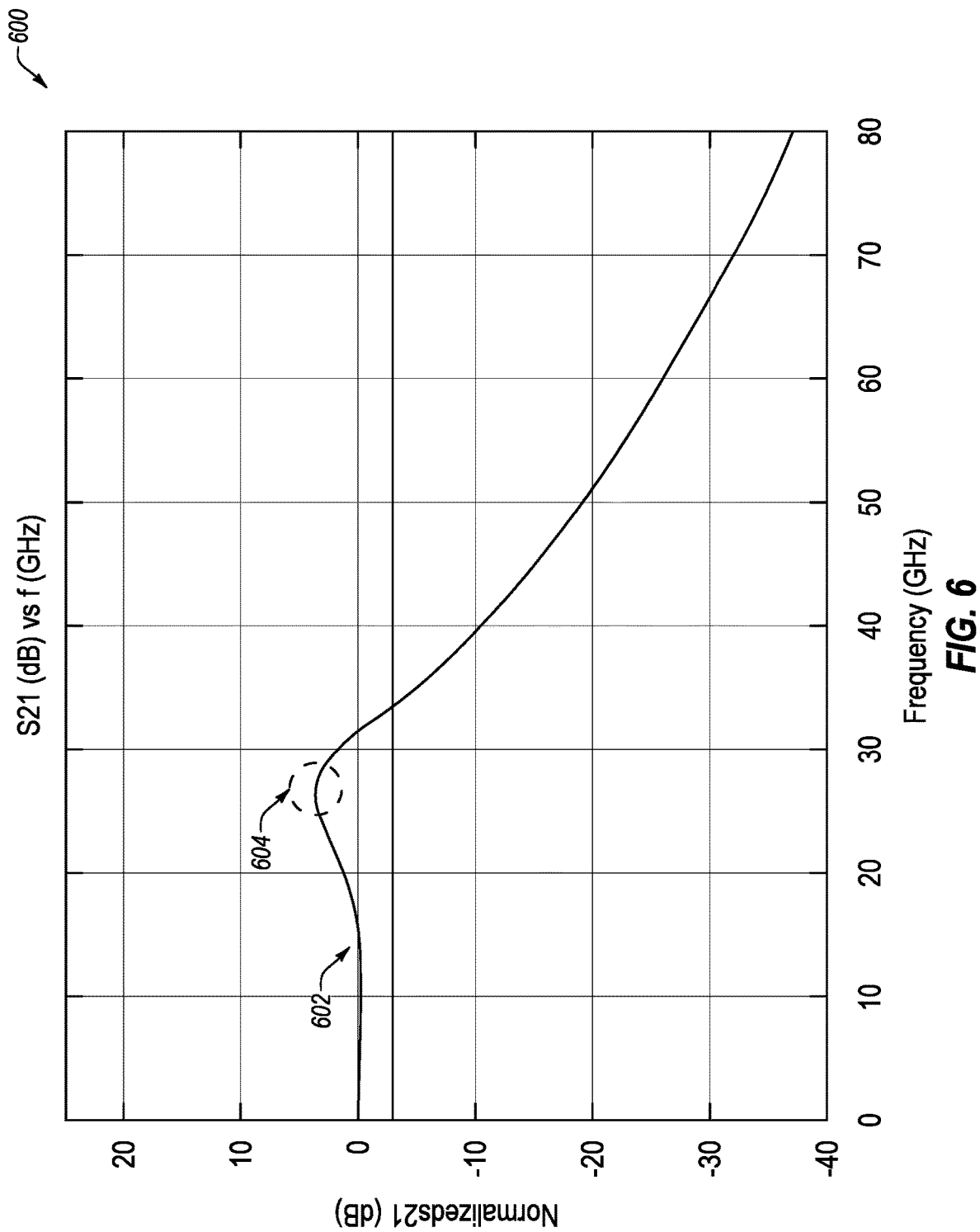
FIG. 6 includes a graphical representation of a simulation of a modulation response of an optical signal emitted by the feedback biased VCSEL of FIG. 1 as a function of frequency.

FIG. 6 includes a graphical representation 600 of a simulation of a modulation response of an optical signal emitted by the feedback biased VCSEL 100 of FIG. 1 as a function of frequency, in accordance with at least one embodiment described herein.

Curve 602 represents the modulation response of the optical signal as a function of the frequency of the optical signal at a feedback strength of roughly 0.16. The circle 604 represents a peak of the modulation response.

In the simulation represented in the graphical representation 600, the modulation response may be relatively flat, meaning the modulation response may not vary much as the frequency of the optical signal increases and/or decreases. In the simulation, the modulation response at a first point represented by circle 604 may be roughly equal to four dB. In the simulation, the modulation response may be roughly zero dB at roughly eighteen GHz at which the modulation response may increase slightly to roughly four dB at roughly twenty eight GHz. The modulation response may decrease to roughly negative thirty six dB at roughly eighty GHz.

Figure 7:
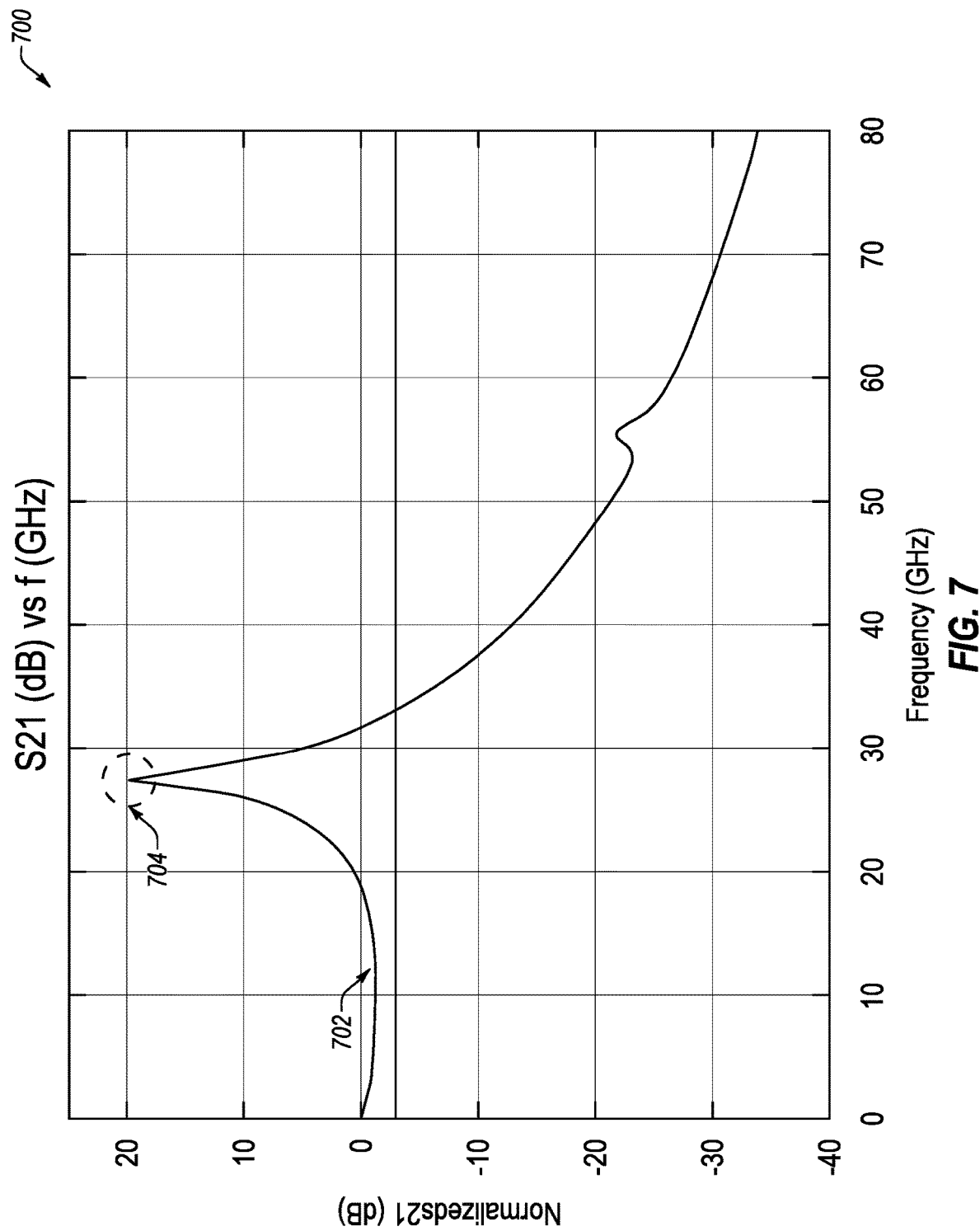
FIG. 7 includes a graphical representation of a simulation of modulation response of an optical signal emitted by the feedback biased VCSEL of FIG. 1 as a function of frequency.

FIG. 7 includes a graphical representation 700 of a simulation of modulation response of an optical signal emitted by the feedback biased VCSEL 100 of FIG. 1 as a function of frequency, in accordance with at least one embodiment described herein.

Curve 702 represents the modulation response of the optical signal as a function of the frequency of the optical signal at a feedback strength of roughly 0.27. The circle 704 represents a peak of the modulation response.

In the simulation represented in the graphical representation 700, the modulation response may be relatively steep, meaning the modulation response may vary significantly as the frequency of the optical signal increases and/or decreases over at least some frequency ranges. In the simulation, the modulation response at a first point represented by circle 704 may be roughly equal to twenty dB. In the simulation, the modulation response may be roughly zero dB at roughly eighteen GHz at which the modulation response may increase to roughly twenty dB at roughly twenty eight GHz. The modulation response may decrease to roughly negative thirty six dB at roughly eighty GHz. Therefore, biasing the feedback biased VCSEL at roughly 0.16 feedback strength may achieve a larger three dB bandwidth that corresponds to a lower resonance peak and a flatter modulation response than biasing the feedback biased VC SEL at roughly 0.27 feedback strength.

Figure 8:
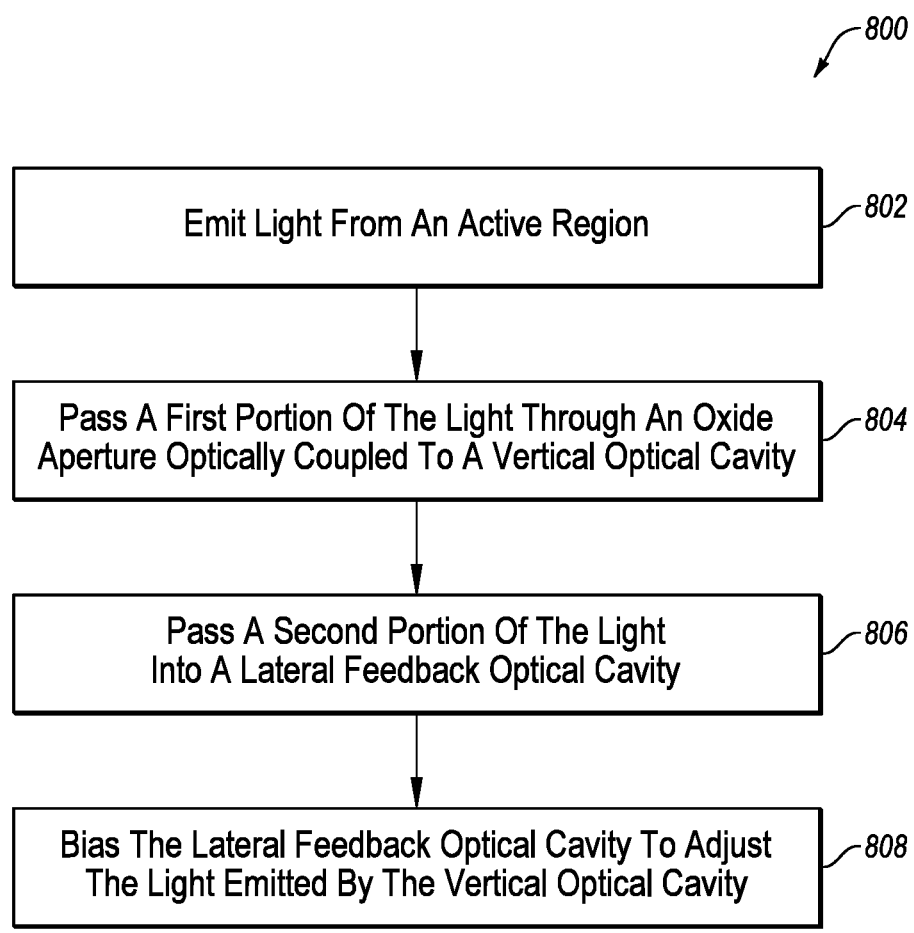
FIG. 8 illustrates a flowchart of a method to bias the feedback biased VCSEL of FIG. 1.

FIG. 8 illustrates a flowchart of a method 800 to bias the feedback biased VCSEL 100 of FIG. 1, according to at least one embodiment described in the present disclosure. The method 800 may be performed, in whole or in part, by a feedback biased VCSEL, such as the feedback biased VCSEL 100 of FIG. 1 Although illustrated with discrete blocks, the steps and operations associated with one or more of the blocks of the method 800 may be divided into additional blocks, combined into fewer blocks, or eliminated, depending on the particular implementation.

The method 800 may include a block 802, at which light may be emitted from an active region. The active region may be included in the feedback biased VCSEL. In some embodiments, a current may be passed through a PN junction to inject carriers into the active region of the feedback biased VCSEL. When the bias current is sufficient, optical gain is produced in the active region and the feedback biased VCSEL may begin to "lase" and the light may be emitted by a vertical cavity, e.g., a vertical optical cavity, as discussed above.

At block 804, a first portion of the light may pass through an oxide aperture optically coupled to the vertical cavity. Alternatively or additionally, the oxide aperture may be included in and/or may at least partially form and/or define the vertical cavity. The oxide aperture may be defined by an oxide layer that includes one or more oxidized regions and one or more unoxidized regions. As disclosed in, e.g., FIGS. 1-3, an isolation implant may divide the oxide aperture into two separate apertures. For example, the oxide aperture may include a vertical cavity oxide layer aperture and a lateral feedback cavity oxide aperture separated by the isolation implant.

At block 806, a second portion of the light may pass into a lateral feedback cavity. The second portion of the light may be reflected towards the vertical cavity by the various layers included in the lateral feedback cavity.

At block 808, the lateral feedback cavity may be biased to adjust the light emitted by the vertical cavity. In some embodiments, biasing the lateral feedback cavity may adjust the gain or the loss of the lateral feedback cavity. For example, reverse biasing the lateral feedback cavity may increase absorption of light within the lateral feedback cavity. As another example, forward biasing the lateral feedback cavity may decrease absorption of light within the lateral feedback cavity.

In some embodiments, the method 800 may include additional operations. For example, the method 800 may also include biasing the lateral feedback cavity with a target feedback strength. Alternatively or additionally, the target feedback strength may be determined as a target feedback strength associated with both a target three dB bandwidth and a target resonance peak. The target feedback strength may be calculated according to Equation 1. Alternatively or additionally, the target feedback strength may be at least 0.05, at last 0.1, or at least 0.15, such as 0.16 or roughly 0.16 (e.g., 0.16 plus or minus 10% or 20%). The target three dB bandwidth may be at least 25 GHz or at least 30 GHz, such as 32.5 GHz or roughly 32.5 GHz. The target resonance peak may be less than 10 dB or less than 5 dB, such as 3 dB or roughly 3 dB. In some embodiments, the feedback strength, the three dB bandwidth, and/or the resonance peak may be measured and/or estimated during operation and may be adjusted up or down until one or more of the measured or estimated values is equal or roughly equal to the corresponding target.

Modifications, additions, or omissions may be made to the method 800 without departing from the scope of the present disclosure. For example, the operations of method 800 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A coupled cavity vertical cavity surface emitting laser (VCSEL) comprising:
    a bottom distributed Bragg reflector (DBR) mirror;
    a top DBR mirror formed above the bottom DBR mirror;
    a vertical optical cavity located within a portion of the bottom DBR mirror and a portion of the top DBR mirror, wherein the vertical optical cavity is configured to emit an optical signal;
    a lateral feedback optical cavity located within a different portion of the bottom DBR mirror and a different portion of the top DBR mirror, wherein the lateral feedback optical cavity is configured to receive a feedback bias signal to bias the lateral feedback optical cavity to adjust the optical signal;
    an active region formed between the bottom DBR mirror and the top DBR mirror and comprising an oxide layer that defines an oxide aperture; and
    an isolation implant formed within the top DBR mirror and configured to electrically isolate the vertical optical cavity from the lateral feedback optical cavity and to create a first aperture and a second aperture within the oxide aperture.

2. The coupled cavity VCSEL of claim 1, wherein the isolation implant extends through the top DBR mirror and the active region at least to the bottom DBR mirror.

3. The coupled cavity VCSEL of claim 1, further comprising a bias metal contact formed on a portion of the top DBR mirror, wherein the bias metal contact is configured to receive the feedback bias signal and provide the feedback bias signal to the lateral feedback optical cavity.

4. The coupled cavity VCSEL of claim 1, wherein the feedback bias signal comprises a direct current (DC) signal.

5. The coupled cavity VCSEL of claim 1, wherein the feedback bias signal comprises a forward bias signal configured to decrease absorption of light in the lateral feedback optical cavity.

6. The coupled cavity VCSEL of claim 1, wherein the feedback bias signal comprises a reverse bias signal configured to increase absorption of light in the lateral feedback optical cavity.

7. The coupled cavity VCSEL of claim 1, further comprising an anti-reflection layer formed above the top DBR mirror.

8. The coupled cavity VCSEL of claim 1, wherein the oxide aperture has a width of between substantially three micrometers and substantially fifteen micrometers.

9. A method of biasing a vertical cavity surface emitting laser (VCSEL), the method comprising:
    emitting light from an active region of the VCSEL;
    passing a first portion of the light through an oxide aperture optically coupled to a vertical optical cavity of the VCSEL;
    passing a second portion of the light into a lateral feedback optical cavity of the VCSEL; and
    biasing the lateral feedback optical cavity to adjust the light emitted by the vertical optical cavity.

10. The method of claim 9, wherein biasing the lateral feedback optical cavity to adjust the light emitted by the vertical optical cavity further comprises biasing the lateral feedback optical cavity with a DC signal.

11. The method of claim 9, further comprising:
    confining the light vertically within the oxide aperture; and
    confining the light laterally within the oxide aperture.

12. The method of claim 9, further comprising adjusting the biasing of the lateral feedback optical cavity to a target feedback strength, wherein the target feedback strength may be associated with both a target three decibel (dB) bandwidth and a target resonance peak of the light emitted by the vertical optical cavity.

13. An optical transceiver comprising:
    a bottom distributed Bragg reflector (DBR) mirror;
    a top DBR mirror positioned above the bottom DBR mirror;
    a vertical optical cavity located within a portion of the bottom DBR mirror and a portion of the top DBR mirror, wherein the vertical optical cavity is configured to emit an optical signal;
    a lateral feedback optical cavity located within a different portion of the bottom DBR mirror and a different portion of the top DBR mirror, wherein the lateral feedback optical cavity is optically coupled to the vertical optical cavity and is configured to receive a feedback bias signal configured to bias the lateral feedback optical cavity to adjust the optical signal emitted by the vertical optical cavity;
    an active region between the bottom DBR mirror and the top DBR mirror comprising an oxide layer which defines an oxide aperture; and
    an isolation implant configured to electrically isolate the vertical optical cavity from the lateral feedback optical cavity and create a first aperture and a second aperture within the oxide aperture.

14. The optical transceiver of claim 13, wherein the isolation implant extends through the top DBR mirror and the active region at least to the bottom DBR mirror.

15. The optical transceiver of claim 13, further comprising a bias metal contact proximate the lateral feedback optical cavity, wherein the bias metal contact is configured to receive the feedback bias signal and provide the feedback bias signal to the lateral feedback optical cavity.

16. The optical transceiver of claim 13, wherein the feedback bias signal comprises a direct current (DC) signal.

17. The optical transceiver of claim 13, wherein the feedback bias signal comprises a forward bias signal configured to decrease absorption of light in the lateral feedback optical cavity.

18. The optical transceiver of claim 13, wherein the feedback bias signal comprises a reverse bias signal configured to increase absorption of light in the lateral feedback optical cavity.

19. The optical transceiver of claim 13, wherein the oxide aperture has a width of between substantially three micrometers and substantially fifteen micrometers.

20. The optical transceiver of claim 13, further comprising an anti-reflection layer proximate the top DBR mirror.

* * * * *